United States Patent [19]

McIver

[11] Patent Number: 5,528,079
[45] Date of Patent: Jun. 18, 1996

[54] HERMETIC SURFACE MOUNT PACKAGE FOR A TWO TERMINAL SEMICONDUCTOR DEVICE

[75] Inventor: Chandler H. McIver, Tempe, Ariz.

[73] Assignee: GI Corporation, Hatboro, Pa.

[21] Appl. No.: 811,726

[22] Filed: Dec. 23, 1991

[51] Int. Cl.[6] .................................................. H01L 23/148
[52] U.S. Cl. ............................................................ 257/698
[58] Field of Search ................................... 357/74, 70, 69;
257/688, 689, 690, 693, 698, 735, 528

[56] References Cited

U.S. PATENT DOCUMENTS

| | | | |
|---|---|---|---|
| 3,820,150 | 6/1974 | Nicolaides | 357/74 |
| 4,935,803 | 6/1990 | Kalfus et al. | 357/69 |
| 4,945,398 | 7/1990 | Kurita et al. | 357/74 |

FOREIGN PATENT DOCUMENTS 54-114973  7/1979  Japan ........................................ 357/70

*Primary Examiner*—William L. Sikes
*Attorney, Agent, or Firm*—Harold James; Robert L. Epstein; James and Franklin

[57] ABSTRACT

A semiconductor package houses a single two terminal semiconductor component. The package is hermetically sealed and is adapted for surface mounting. The package consists of an open ceramic box that has slots for external leads. A glass seal provides the means for sealing the leads to the ceramic box. The semiconductor element is in a die form and one terminal is directly bonded to one of the external leads. The other terminal is bonded to a clip that in turn is bonded to the other lead. A lid is sealed to the top of the ceramic box to provide the hermetic seal.

12 Claims, 2 Drawing Sheets

HERMETIC SURFACE MOUNT PACKAGE FOR A TWO TERMINAL SEMICONDUCTOR DEVICE

DESCRIPTION

TECHNICAL FIELD

Applicants' invention relates generally to semiconductor packages and more particularly to a two terminal device in a hermetically sealed package for surface mounting on a printed circuit board assembly.

BACKGROUND ART

Packages containing two leaded semiconductor devices are well known. In many instances these devices are packaged in metal cans if a hermetic seal is required, especially if the device is large. These packages are usually stud mounted which makes it difficult to insert them onto printed circuit board assemblies. Surface mount technology provides a means for reducing circuit board assembly times and costs. In the past it has been difficult to package these types of larger components in surface mountable packages because of the thermal stress at the junction of the package and the external leads of the semiconductor device. Further, dissipating the heat generated by the operation of the semiconductor element has been another problem. Attaching the external leads required intermediate connections between the leads and the semiconductor element. These intermediate connections also result in heat buildup internal to the package. The present invention eliminates these and other problems without loss of performance or reliability.

SUMMARY OF THE INVENTION

Accordingly, the principal object of the present invention is to provide a package for housing a single, two terminal semiconductor component. The package is hermetically sealed and is adapted for use with surface mount technology.

It is a further object of the invention to provide a package that minimizes the thermal stresses present at the junction of the external leads and the package. Large and flexible leads provide part of the relief and add the further benefit of maximizing heat dissipation of the semiconductor device within the package.

Yet another object of the invention is to provide a package that increases the electrical conductivity between the semiconductor device and the external leads.

In one embodiment of the invention, the package consists of a nonconductive material such as ceramic or alumina that is formed into a rectangular open box. The two leads are inserted through slots on opposite sides of the box. The semiconductor die is directly attached to one of the leads, internal to the package and the other lead is connected to the top of the semiconductor die by means of a preformed, conductive metal alloy clip, also internal to the package. A cover or lid is sealed on top of the box to complete the package. A glass or brazed alloy seal is utilized between the leads and the sides of the package. The result is a package that can be used for high reliability applications.

Other features and advantages of the invention will be apparent from the following specification taken in conjunction with the accompanying drawings in which there is shown a preferred embodiment of the invention. Reference is made to the claims for interpreting the full scope of the invention which is not necessarily represented by such embodiment.

DETAILED DESCRIPTION

Although this invention is susceptible to embodiments of many different forms, a preferred embodiment will be described and illustrated in detail herein. The present disclosure exemplifies the principles of the invention and is not to be considered a limit to the broader aspects of the invention to the particular embodiment as described.

Figure 1:
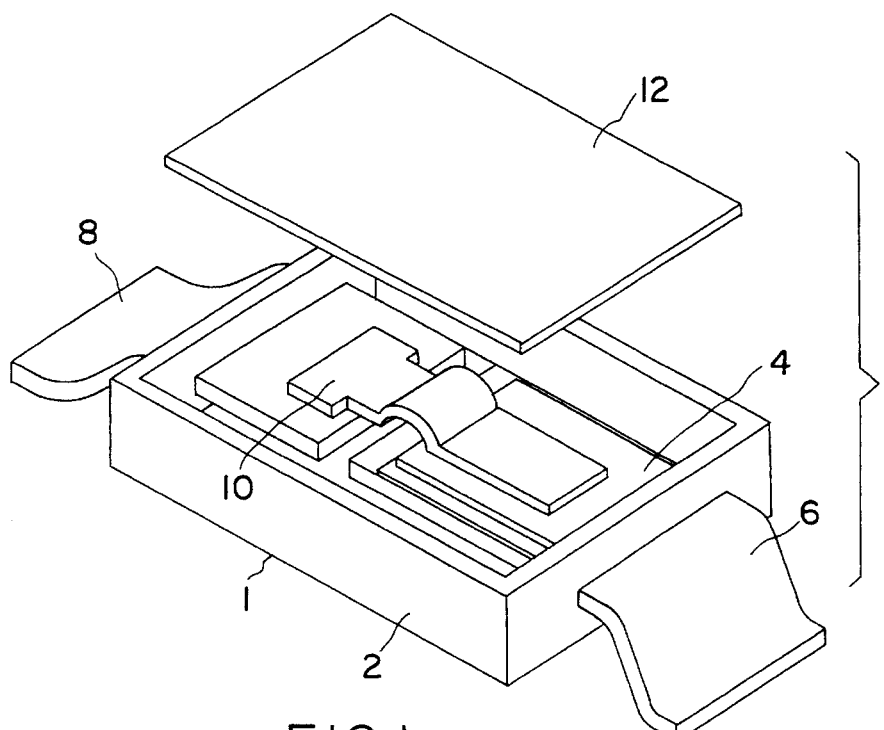
FIG. 1 is an isometric view of the package constructed according to the present invention.

Referring now to FIG. 1 of the drawings, a two terminal semiconductor device 1 is illustrated. A base 2 provides the packaging for a semiconductor die 4. Gull wing shaped leads 6 and 8 extend from the exterior of the package to the interior thereof. Lead 6 contacts one electrode of the semiconductor die 4. A highly conductive metal crossover clip 10 connects the second electrode of the semiconductor die 4 to the other lead 8. Lid 12 is hermetically sealed to the top of the base 2 to complete the assembly.

Figure 2:
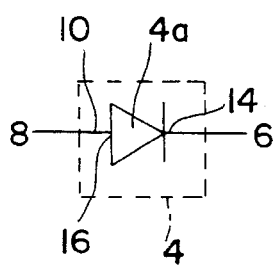
FIG. 2 is a schematic diagram representing a typical two terminal semiconductor device.

In one embodiment of the invention, the semiconductor die 4 is a diode 4a having a PN junction as represented by FIG. 2. The diode 4a has a cathode 14 and anode 16. The cathode 14, which is on the bottom portion of the die 4, has an electrode which is electrically bonded to the lead 6. The electrode of the anode 16, which is on the top portion of the die 4, is electrically bonded to the clip 10, which in turn is electrically bonded to the lead 8, completing the circuit. Other types of two terminal devices could also be attached in a similar manner. These could be, but are not restricted to, zener diodes, voltage suppressors, resistors, and capacitors.

Figure 3:
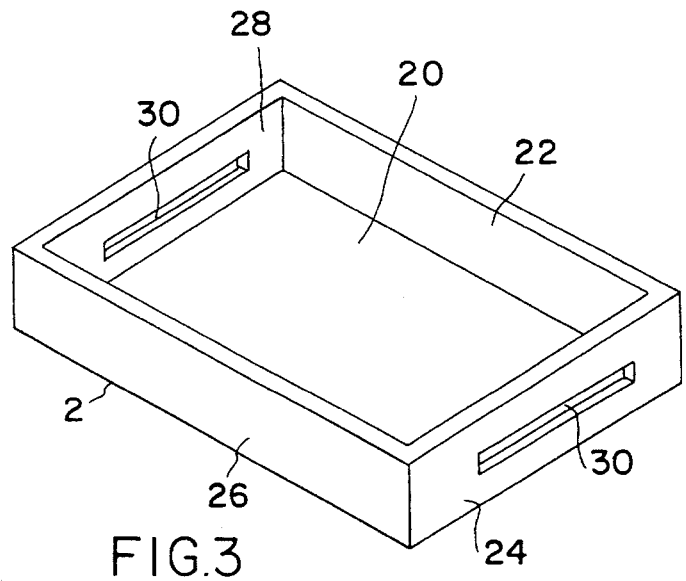
FIG. 3 shows an isometric view of the base of the package.
Figure 4:
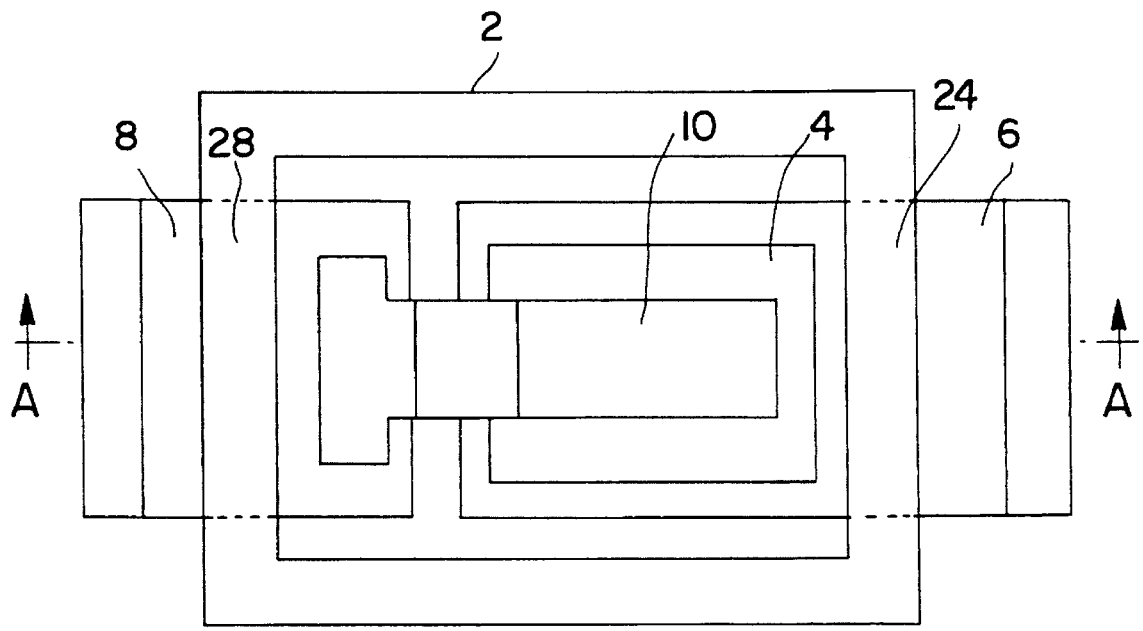
FIG. 4 is a top view of the package with the cover removed.

The base 2 is shown in greater detail in FIG. 3. The ceramic base 2 is a rectangular shaped box having a bottom 20 and four sides 22, 24, 26, and, 28. The base 2 generally would be formed from alumina. The bottom 20 is metallized to accept a brazing compound 31 by silk screening a thick film material to it. Opposite sides 28 and 24 have an elongated slot 30 which has sufficient length and width for inserting lead 6 or 8 through it. Slots 30 are offset slightly above the bottom 20, forming a gap. The brazing compound 31 fills this gap and bonds the leads 6 and 8 to the metallized surface of the bottom 20. This allows the leads 6 and 8 to float in the interior of the base 2 forming a platform for attaching the diode 4a and the clip 10 as indicated by FIG. 4. The T-shaped end 10c of clip 10 provides more surface area for attaching the clip to the lead 8.

The leads 6 and 8 can be made from any type of highly conductive metal material. In the preferred embodiment they are made from an alloy of copper that is nickel and gold plated. Metal clad copper could also be used and the leads 6 and 8 are also spring tempered. The exterior portion of the leads 6 and 8 can be preformed before insertion into the slots or can be formed after assembly. The leads can be formed into the common gull wing shape as in FIG. 1 or "C" shaped as in FIG. 5. The formed leads provide the means for surface mounting the completed package to a printed circuit board. They are wide and flexible to maximize the dissipation of heat that may be generated by the diode 4a or any other type of two terminal semiconducter devices that may be in the package. Their structure also minimizes the thermal stresses present at the junction between the leads 6 and 8 and the side walls 28 and 30. The leads 6 and 8 allow the completed assembly of semiconductor device 1 to be raised slightly above the printed circuit board.

Figure 5:
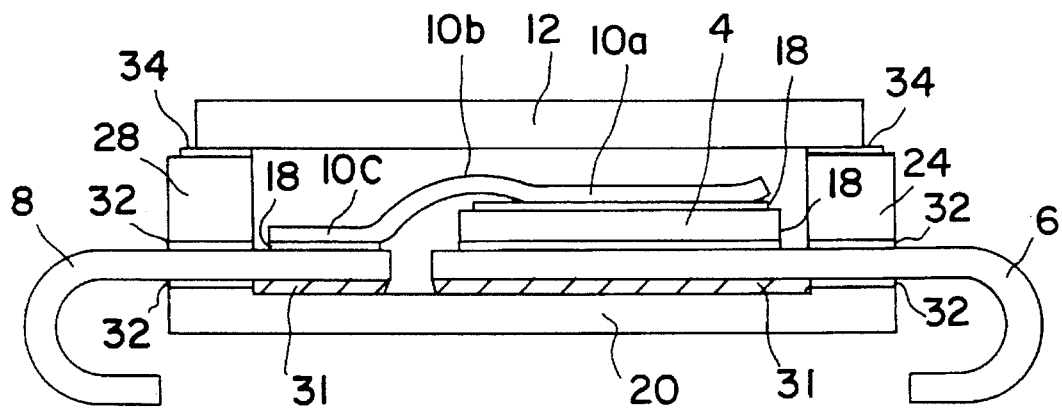
FIG. 5 discloses a section view of FIG. 4 taken along section line A and with the cover in place to illustrate the details of bonding the various elements together.

The cutaway side view of FIG. 5 shows greater details in the assembly of the packaged device. The bottom of semiconductor die 4 has a metallized surface for electrically bonding to the first lead 6. Various die bonding and soldering techniques are very well known in the manufacturing of semiconductors. For the described embodiment, a gold-germanium solder alloy 18 provides the bonding means. One end 10a of clip 10 is bonded to the metallized top of semiconductor die 4 by the same technique of solder bonding. The other end 10c of clip 10 is bonded to the second lead 8 in similar fashion.

The sections 10a and 10c are parallel and are connected by a curved section 10b. Since the height of the die 4 and the lead 8 are different, the curved section 10b provides compensation for this difference. The material for clip 10 is selected to have a coefficient of thermal expansion that minimizes the stresses that are present at the bonding areas during the thermal cycling of the semiconductor device 1 during normal operation. In the preferred embodiment the clip 10 is made from an alloy of copper that is nickel and gold plated, similar to the material that is used for leads 6 and 8.

After bonding of the semiconductor die 4, the clip 10, and the leads 6 and 8, a glass seal 32 is formed at the interface between the lead 6 and the side wall 24 and between the lead 8 and the side wall 28. The seal 32 could also be formed by brazing. The lid 12 is sealed to the top of the base 2 to provide a hermetic package. The lid could be ceramic or metal. Sealing is accomplished by using either solder or glass preforms 34 which have been precoated to the lid 12.

While the specific embodiments have been illustrated and described, numerous modifications are possible without departing from the scope or spirit of the invention.

I claim:

1. A semiconductor device comprising:
   (A) a semiconductor element having a lower bonding surface and an upper bonding surface;
   (B) an open rectangular ceramic body including a lower surface, a first side containing an elongated opening, a second side, a third side containing an elongated opening, said third side opposite from said first side, and a fourth side, said fourth side opposite from said second side, said four sides for enclosing said semiconductor device;
   (C) a conductive member;
   (D) a first external lead extending through said elongated opening in said first side to the interior of said ceramic body;
   (E) a second external lead extending through said elongated opening in said third side to the interior of said ceramic body;
   (F) a cover;
   (G) wherein said semiconductor element, conductive member and portions of said leads are loosely received within a space having a volume significantly less than the interior of said body with the lower bonding surface of said semiconductor element directly bonded to the interior portion of said first external lead, wherein said upper bonding surface of said semiconductor element is bonded to a first end of said conductive member and wherein a second end of said conductive member is bonded to the interior portion of said second external lead;
   (H) wherein said first lead is sealed at the junction with said elongated opening of said first side and said second lead is sealed at the junction with said elongated opening of said third side; and
   (I) wherein said cover is hermetically sealed on top of said open rectangular ceramic body.

2. The semiconductor device of claim 1 wherein said first external lead and said second external lead are formed from a metal alloy of copper and are nickel and gold plated, said external leads being oversized to increase electrical conductivity and to minimize thermal stress at the junction of said external leads and said elongated openings.

3. The semiconductor device of claim 2 wherein said bonding of said semiconductor element to said first external lead provides a means of heat transference between said semiconductor element and said external lead.

4. The semiconductor device of claim 1 wherein said bonding of said semiconductor element to said first external lead and said conductive member is by soldering.

5. The semiconductor device of claim 4 wherein said soldering of said semiconductor element to said first external lead and said conductive member uses a 357 degree gold-germanium solder alloy.

6. The semiconductor device of claim 1 wherein said sealing of the first lead at the junction with said elongated opening of said first side and the second lead at the junction with said elongated opening of said third side is a glass seal.

7. The semiconductor device of claim 1 wherein said hermetically sealing of said cover to the top of said open rectangular ceramic body is by soldering, said solder utilizing a solder preform precoated to said cover.

8. The semiconductor device of claim 1 wherein said hermetically sealing of said cover to the top of said open rectangular ceramic body is by utilizing a glass preform precoated to said cover.

9. The semiconductor device of claim 1 wherein said semiconductor element is a diode.

10. The semiconductor device of claim 1 wherein said semiconductor element is a transient surge suppressor.

11. The semiconductor device of claim 1 wherein said semiconductor element is a resistor.

12. The semiconductor device of claim 1 wherein said semiconductor element is a capacitor.

* * * * *